United States Patent [19]

Hargrave et al.

[11] Patent Number: 5,521,794

[45] Date of Patent: May 28, 1996

[54] RADIO COMPRISED OF FLEXIBLE ELEMENTS

[75] Inventors: Phillip C. Hargrave, Palatine; Thomas A. Knecht, Algonquin, both of Ill.

[73] Assignee: Motorola, Inc., Schaumburg, Ill.

[21] Appl. No.: 392,005

[22] Filed: Feb. 21, 1995

[51] Int. Cl.⁶ .................... H04B 1/03; H05K 5/02
[52] U.S. Cl. ............. 361/814; 361/796; 361/784; 361/748; 174/52.2; 174/52.4; 455/347; 257/787
[58] Field of Search .................... 361/752, 796, 361/784, 814, 748; 174/50, 52.2, 52.3, 52.4; 204/208; 455/347; 136/243; 257/787

[56] References Cited

U.S. PATENT DOCUMENTS 4,939,792   7/1990   Urbish et al. ............... 455/347

Primary Examiner—Gerald P. Tolin
Assistant Examiner—Y. Whang
Attorney, Agent, or Firm—Frank M. Scutch, III

[57] ABSTRACT

A radio (100) which includes a plurality of printed circuit boards (101) which are positioned in a planar arrangement so to provide a substantially flat structure. The printed circuit boards (101) are connected using flexible conductors (105) which mechanically and electrically couple the printed circuit boards (101) and provide a flexible link to allow the printed circuit boards (101) to be manipulated into various configurations. A flexible radio housing (151) is used to encapsulate the printed circuit boards (101) and flexible conductors (105) allowing radio (100) to be impacted and/or easily manipulated without crushing the contents. The radio (100) may be worn and easily concealed on the body without risk of breakage.

7 Claims, 3 Drawing Sheets

5,521,794

RADIO COMPRISED OF FLEXIBLE ELEMENTS

TECHNICAL FIELD

This invention relates in general to radios and more particularly to flexible radios which, can be worn on the human body.

BACKGROUND

In the past, radios which were small and intended to be worn on the human body had to be specially concealed in order to hide their shape or contour. Traditionally radios used for sporting activities or those used in law enforcement are cumbersome to wear due to the their size and shape. Two-way radios particularly are dimensionally thick in shape which causes problems in user comfort and concealment. This becomes an even bigger issue when high amounts of physical activity are required.

In order to allow users to conceal this type of radio, such devices as internal clips, holsters, chest harnesses must be used. Often these devices must be used with some type of adhesive in order to enable the radio to remain fastened to the body for any length of time. Many attempts have been made to change a radio in size and shape to make the radio more comfortable to wear. One approach is to merely make the radio as small as possible by stacking the printed circuit boards used in the radio. This has the effect of making the radio a small size but creates a wide or thick radio which may not be appropriate for all situations. Another approach has been to actually incorporate the radio into an article of clothing such as a shirt or vest. This too is sometimes inappropriate since the radio may be easy to carry but may also be easily detected when concealment is an issue.

Therefore the need exists to produce a radio which may be easily fastened to the body, easily carried and easily concealed. The radio should be capable of being used for long periods without user fatigue and be capable of being used where strenuous physical tasks are required.

DETAILED DESCRIPTION OF THE PREFERRED EMBODIMENT

Figure 1:
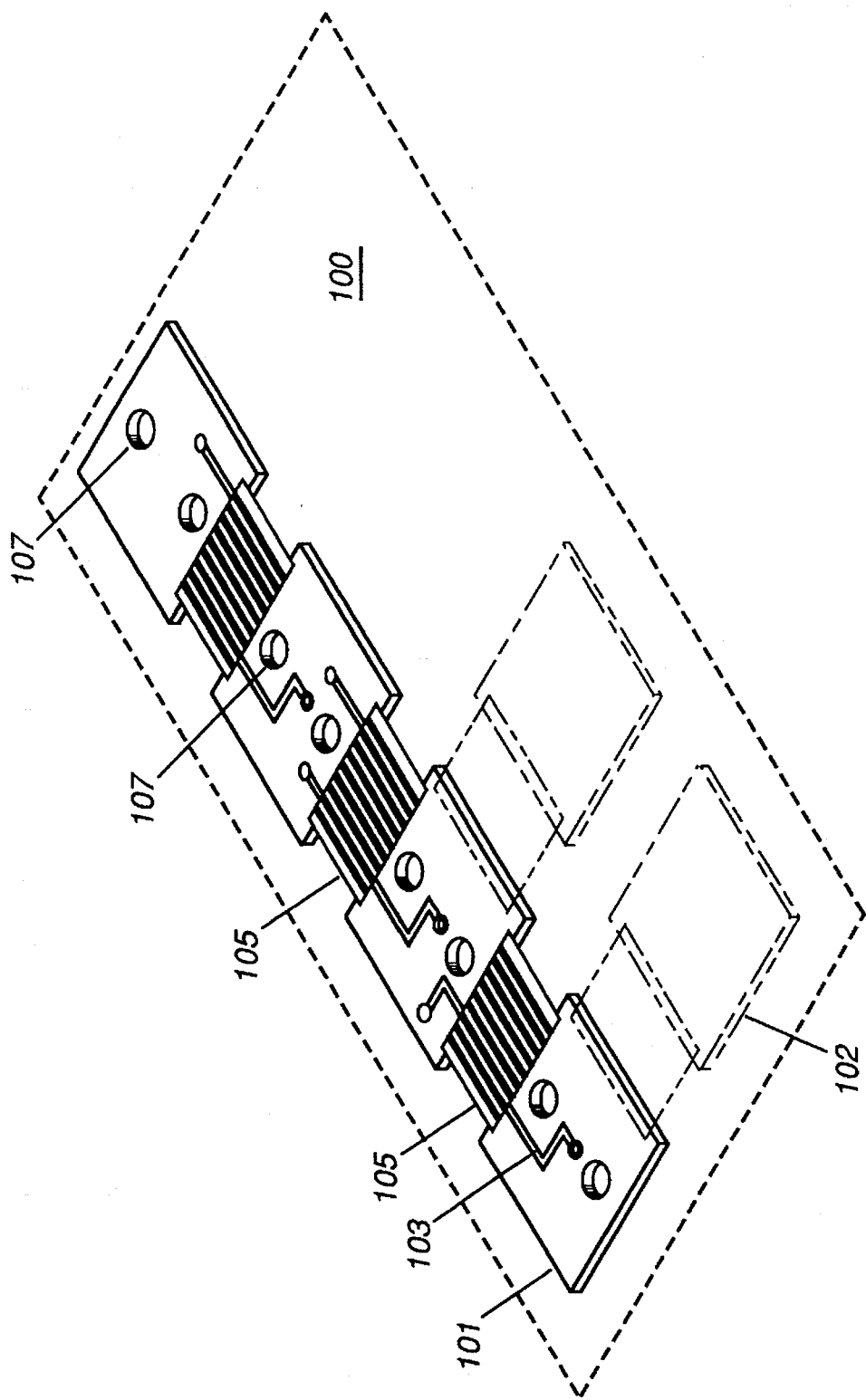
FIG. 1 is a perspective view of a fiat flexible radio showing connection of the printed circuit boards used in accordance with the present invention.

Referring now to FIG. 1, a flat portable radio 100 includes a plurality of printed circuit boards 101. The printed circuit boards 101 are made of a substantially flat substrate material that is capable of a limited degree of flexing without breakage to the board and/or substrate material. Metal traces 103 run along and across both surfaces of each printed circuit board 101 and act to interconnect discrete components placed upon the printed circuit board 101. The printed circuit boards 101 may be aligned longitudinally or positioned in a grid-like pattern capable of forming a single planar structure. A printed circuit board 102 is shown in phantom as connected to a side of printed circuit board 101. It will be evident to those skilled in the art that any printed circuit board configuration is possible that will allow the user to both conceal the radio 100 comfortably and allow it to be worn on the body.

Each printed circuit board 101 is interconnected with the other boards using a flex connector 105. The flex connector 105 may be any custom flex circuit board or flex connector like that made by Multifineline, Inc. or the like. The flex connector 105 is positioned at the edge of a printed circuit board 101 to interconnect metal traces 103 that are positioned at an edge of the printed circuit board 101. The flex connector 105 not only provides electrical interconnection between the printed circuit board 101 but it also enhances mechanical integrity between each printed circuit board 101 allowing it to bend, flex, or twist in each of an X, Y, or Z axis. The printed circuit board 101 further includes a plurality of apertures or holes 107 that allow the radio housing (not shown) to be fastened through the printed circuit board 101 with specialized fasteners or protrusions.

Figure 2:
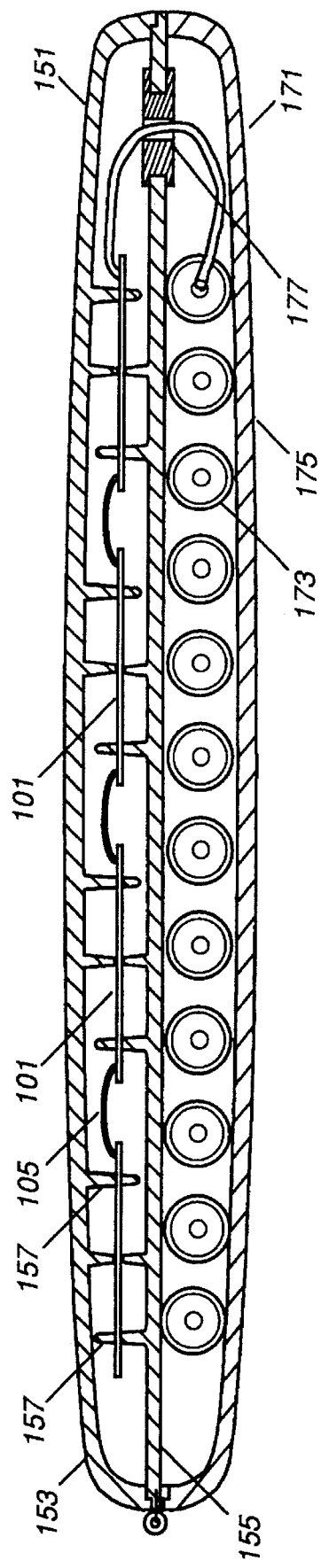
FIG. 2 is a partial cross-sectional side-elevational view of the fiat flexible radio shown in FIG. I with the radio housing and battery installed.

FIG. 2 shows a partial cross-sectional view of flat portable radio 100 in which the radio housing 151 is installed around each of the printed circuit boards 101. The radio housing 151 is optimally manufactured using a flexible rubberized plastic that has resilient properties. The radio housing 151 includes an upper half 153 and lower half 155. Both the upper half 153 and lower half 155 include one or more fasteners or protrusions 157. Protrusions 157 are attached to the interior surface of the upper half 153 and lower half 155 and are also manufactured out of a rubberized plastic material enabling them to bend and/or flex with the radio housing 151. The protrusions 157 are shaped to have a greater diameter at their root or base and are used to protrude through the aperture 107 on the printed circuit board 101. The protrusions 157 also vary in length so as some of the protrusions 157 protrude through the aperture 107 and contact the interior surface of the opposite side. Other protrusions 157 are shortened only to contact the surface of a printed circuit board 101. Protrusions 157 further align axially to contact the printed circuit board 102 in sets of two, one protruding from each side of radio housing 151. This arrangement allows the printed circuit board 101 to flex within the radio housing 151 while still maintaining a semi rigid structure in which each printed circuit board will not move significantly within the radio housing 151.

As also can be seen in FIG. 2, a battery 171 includes a plurality of interconnected battery cells 173 that are oriented in a fashion to permit the greatest flexibility. The battery 171 further includes a flexible battery housing 175, oriented in a plane different from that of printed circuit board 101, that interconnects to the flat portable radio 100 through a battery port 177. The flexible battery housing 175 is positioned to be substantially aligned with the radio housing 151 so each form an integral unitary body that is substantially flat and can be easily worn and/or concealed on the human body.

Figure 3:
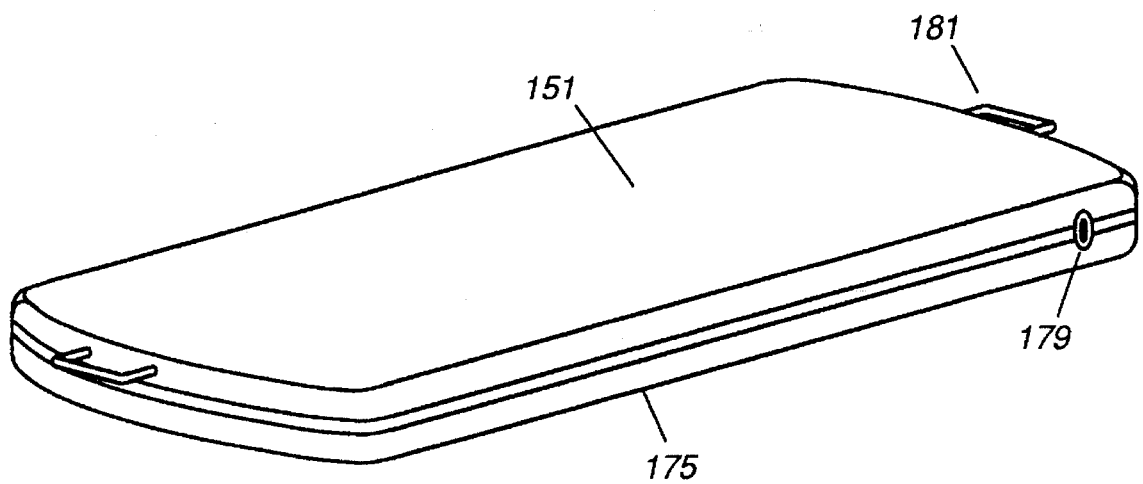
FIG. 3 is a perspective view of the fiat portable radio with the radio housing and battery installed.

FIG. 3 illustrates a perspective view of the radio housing 151 and flexible battery housing 175 integrally connected together. A control port 179 is also shown that is used to connect an external control head (not shown) for remote controlling the flat portable radio 100. This control head provides a speaker, microphone or any control interfaces that may appear on a conventional radio. A plurality of attachment clips 181 are used to secure the flat portable radio 100 to a user's body using a belt, harness, or any other method of attachment.

Figure 4:
FIG. 4 is a side view of the fiat portable radio showing how the radio housing may flex to accommodate the user.

FIG. 4 illustrates a side view of the flat portable radio 100 in a flexed position 201 (shown in phantom) that allows it to match the contour needed for any particular application. As noted above, the radio housing 151 is made of a rubberized plastic material with flexible and resilient properties allowing it to return to an original position 203 if required without damage to any internal circuitry within the flat portable radio 100.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A radio, including:
   A) a plurality of printed circuit boards positioned substantially in a first plane;
   B) at least one flexible conductor mechanically and electrically coupled to two of the plurality of printed circuit boards, thereby comprising a flexible link between the two printed circuit boards;
   C) a housing that substantially encapsulates the plurality of printed circuit boards and the at least one flexible conductor, wherein the housing is comprised of flexible material; and
   D) a flexible battery comprised of a plurality of cells that is electrically coupled to at least one of the plurality of printed circuit boards.

2. The radio of claim 1, wherein the housing is comprised of flexible, resilient material.

3. The radio of claim 1, wherein the battery and housing are coupled such that a resultant combined structure comprised of the housing and the battery is flexible and resilient.

4. A radio, including:
   A) a plurality of printed circuit boards positioned substantially in a first plane;
   B) at least one flexible conductor mechanically and electrically coupled to two of the plurality of printed circuit boards, thereby comprising a flexible link between the two printed circuit boards;
   C) a housing that substantially encapsulates the plurality of printed circuit boards and the at least one flexible conductor, wherein the housing is comprised of flexible, resilient material;
   D) a flexible battery that is electrically coupled to at least one of the plurality of printed circuit boards, wherein the flexible battery is comprised of a plurality of cells that are disposed in a second plane, which second plane is substantially parallel to the first plane, wherein the flexible battery and housing are coupled such that a resultant combined structure comprised of the housing and the flexible battery is flexible and resilient.

5. The radio of claim 4, wherein at least some of the plurality of printed circuit boards have holes formed therethrough.

6. The radio of claim 5, wherein the housing has a plurality of protrusions formed on at least one interior surface thereof, such that at least some of the plurality of protrusions extend through at least some of the holes formed through at least some of the plurality of printed circuit boards.

7. The radio of claim 5, wherein at least two opposing interior surfaces of the housing each have a plurality of protrusions formed thereon, such that at least some of the plurality of protrusions extend through at least some of the holes formed through at least some of the plurality of printed circuit boards.

* * * * *